US012752344B2

(12) United States Patent
Schier et al.

(10) Patent No.: US 12,752,344 B2
(45) Date of Patent: Oct. 6, 2026

(54) COATED CUTTING TOOL WITH AN ALTERNATING LAYER COMPOSITION

(71) Applicant: WALTER AG, Tubingen (DE)

(72) Inventors: Veit Schier, Tubingen (DE); Wolfgang Engelhart, Tubingen (DE)

(73) Assignee: Walter AG, Tubingen (DE)

( * ) Notice: Subject to any disclaimer, the term of this patent is extended or adjusted under 35 U.S.C. 154(b) by 591 days.

(21) Appl. No.: 18/265,138

(22) PCT Filed: Dec. 2, 2021

(86) PCT No.: PCT/EP2021/084033

§ 371 (c)(1),
(2) Date: Jun. 2, 2023

(87) PCT Pub. No.: WO2022/117754

PCT Pub. Date: Jun. 9, 2022

(65) Prior Publication Data

US 2024/0024957 A1 Jan. 25, 2024

(30) Foreign Application Priority Data

Dec. 3, 2020 (EP) .................................... 20211504

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 14/3464* (2013.01);
(Continued)

(58) Field of Classification Search
CPC ................ B23B 27/148; C23C 14/641; C23C 14/3464; C23C 14/3485; C23C 14/0036;
(Continued)

(56) References Cited

FOREIGN PATENT DOCUMENTS

| | | | |
|---|---|---|---|
| BG | 1464 U1 * | 7/2011 |
| EP | 3103572 A1 | 12/2016 |
| JP | 2007030098 A | 2/2007 |
| JP | 2018-94670 * | 6/2018 |
| JP | 2018094670 A | 6/2018 |

OTHER PUBLICATIONS

Flink et al. "Structure and properties of Al—Ti—Si—N coatings prepared by cathodic arc ion plating method for high speed cutting applications,", Surface and Coatings Technology 146 (2001) 215-221.

Tanaka et al. "Structure and properties of Al—Ti—Si—N coatings prepared by cathodic arc ion plating method for high speed cutting applications,", Surface and Coatings Technology 146 (2001) 215-221.

(Continued)

*Primary Examiner* — Moshe Wilensky
(74) *Attorney, Agent, or Firm* — Corinne R. Gorski

(57) ABSTRACT

A coated cutting tool includes a substrate and a coating. The coating has a (Ti,Al,Si)N layer, which has a periodical change in contents of the elements Ti, Al, and Si, over the thickness of the (Ti,Al,Si)N layer, between a minimum content and a maximum content of each element. The average minimum content of Ti is from 14 to 18 at. % and the average maximum content of Ti is from 18 to 22 at. %. The average minimum content of Al is from 18 to 22 at. % and the average maximum content of Al is from 24 to 28 at. %. The average minimum content of Si is from 0 to 2 at. % and the average maximum content of Si is from 1 to 5 at. %. The remaining content in the (Ti,Al,Si)N layer is a noble gas in an average content of from 0.1 to 5 at. % and the element N.

15 Claims, 6 Drawing Sheets

(51) Int. Cl.
*C23C 14/34* (2006.01)
*H01J 37/34* (2006.01)

(52) U.S. Cl.
CPC ...... *C23C 14/3485* (2013.01); *H01J 37/3405* (2013.01); *H01J 37/3426* (2013.01); *H01J 37/3467* (2013.01); *H01J 2237/332* (2013.01)

(58) Field of Classification Search
CPC ..... C23C 14/024; C23C 28/044; C23C 28/42; C23C 28/048; C23C 30/005; H01J 37/3405; H01J 37/3426; H01J 37/3467; H01J 2237/332
See application file for complete search history.

(56) References Cited

OTHER PUBLICATIONS

C.F. M.E. Fitzpatrick et al. A Measurement Good Practice Guide No. 52; "Determination of Residual Stresses by X-ray Diffraction—Issue 2", 2005).
Wu Z L et al. "Effect of mictrostructure on mechanical and tribological properties of TiALSiN nanocomposite coatings deposited by modulated pulsed power magnetron sputtering", Thin Solid Films, vol. 597, Feb. 1, 2015, pp. 197-205.
Liu Hui et al: "Effect of modulation structure on the microstructural and mechanical properties of TiAlSiN/CrN thin films prepared by high power impulse magnetron sputtering", Surface and Coatings Technology, vol. 358, pp. 577-585.

* cited by examiner

COATED CUTTING TOOL WITH AN ALTERNATING LAYER COMPOSITION

RELATED APPLICATION DATA

This application is a § 371 National Stage Application of PCT International Application No. PCT/EP2021/084033 filed Dec. 2, 2021 claiming priority to EP 20211504.4 filed Dec. 3, 2020.

TECHNICAL FIELD

The present invention relates to a coated cutting tool for metal machining wherein the cutting tool has a coating comprising a (Ti,Al,Si)N layer.

BACKGROUND

There is a continuous desire to improve cutting tools for metal machining so that they last longer, withstand higher cutting speeds and/or other increasingly demanding cutting operations. Commonly, a cutting tool for metal machining comprises a hard substrate material such as cemented carbide which has a thin hard coating usually deposited by either chemical vapour deposition (CVD) or physical vapour deposition (PVD). Examples of cutting tools are cutting inserts, drills or endmills. The coating should ideally have a high hardness but at the same time possess sufficient toughness in order to withstand severe cutting conditions as long as possible.

PVD (Ti,Al)N coatings are commonly used as wear resistant coatings in cutting tools.

There are different methods of PVD and they give different characteristics of the deposited coating.

Cathodic arc evaporation uses an electric arc to vaporise material from a cathode target. The vaporised material, or a compound thereof, is then condensed on a substrate. Cathodic arc evaporation has advantages of high deposition rate but drawbacks such as droplets of target material are included in the coating and as well on the surface. This may create weakness in the coating and a comparatively rough surface. In many metal cutting applications a smooth surface of a deposited wear resistant coating is beneficial.

Reactive sputtering is a second method of PVD. In this method a plasma of ionised inert gas is created which is made bombarding a target material. Atoms from the target material are ejected and accelerated towards a substrate in the presence of a reactive gas, e.g., nitrogen. Since there is no problem with droplet formation a coating with a smooth surface is generally obtained. However, there is quite difficult to get a high metal ionisation. Also, sputtering is a quite slow deposition process.

High-power impulse magnetron sputtering (HIPIMS) is a special type of sputtering allowing for great flexibility in varying process parameters, especially the power level used (average power, peak pulse power) in combination with pulse on-time and using high bias voltages. HIPIMS enables high metal ionisation and allows for high quality coatings to be provided and by controlling the levels of metal ionisation very special coatings may be produced.

In a severe cutting condition the thermal resistance of the coating is particularly important. By thermal resistance is herein meant a low thermal conductivity of the coating which then protects the cutting tool body from excessive heat which is damaging for the substrate. The more heat protective the coating the better the wear resistance of the coated cutting tool. A better wear resistance means a longer tool life.

It is known that the high temperature stability of a coating is improved by including Si within the coating. (Ti,Al,Si)N coatings are known examples of wear resistant coatings.

However, a drawback with (Ti,Al,Si)N is that already at moderate Al contents of the metal elements, together with Si in an amount of only a couple of at % of the metal elements, a structure may form which is partly hexagonal and amorphous. See, e.g., Flink et al., "Structure and thermal stability of arc evaporated $(Ti_{0.33}Al_{0.67})_{1-x}Si_xN$ thin films", Thin Solid Films 517(2008), 714-721, which discloses the appearance of hexagonal phase above 2 at % Si and Tanaka et al., "Structure and properties of Al—Ti—Si—N coatings prepared by cathodic arc ion plating method for high speed cutting applications,", Surface and Coatings Technology 146 (2001) 215-221, which discloses the appearance of hexagonal phase above 5 at % Si. The hexagonal phase contributes to bad mechanical properties, such as insufficient hardness and insufficient Young's modulus.

It is therefore desired to provide a (Ti,Al,Si)N coating which has a crystalline structure as is the case for, i.e., a cubic solid-solution structure and which has good mechanical properties.

Object of the Invention

The object of the present invention is to provide a cutting tool having a coating comprising a (Ti,Al,Si)N layer with high thermal resistance and excellent tool life.

THE INVENTION

It has now been provided a coated cutting tool which satisfies the above-mentioned objectives. The coated cutting tool comprises a substrate and a coating, the coating comprises a (Ti,Al,Si)N layer, the (Ti,Al,Si)N layer comprises a periodical change in contents of the elements Ti, Al, and Si, over the thickness of the (Ti,Al,Si)N layer, between a minimum content and a maximum content of each element, wherein the average minimum content of Ti being from 14 to 18 at. %, preferably from 15 to 17 at. %, the average maximum content of Ti being from 18 to 22 at. %, preferably from 19 to 21 at. %, the average minimum content of Al being from 18 to 22 at. %, preferably from 19 to 21 at. %, the average maximum content of Al being from 24 to 28 at. %, preferably from 25 to 27 at. %, the average minimum content of Si being from 0 to 2 at. %, preferably from 0 to 1 at. %, the average maximum content of Si being from 1 to 5 at. %, preferably from 2 to 4 at. %, the remaining content in the (Ti,Al,Si)N layer being a noble gas in an average content of from 0.1 to 5 at. % and the element N.

The average distance between two consecutive maxima in content, and between two consecutive minima in content, of any of the elements Ti, Al, and Si is from 3 to 15 nm.

In the periodical change in contents of the elements Ti, Al, and Si over the thickness of the (Ti,Al,Si)N layer the maximum content of Ti, the minimum content of Al and the minimum content of Si coincide in average over the thickness of the (Ti,Al,Si)N layer, and, the minimum content of Ti, the maximum content of Al and the maximum content of Si coincide in average over the thickness of the (Ti,Al,Si)N layer.

There is an average gradual change in contents of Ti per distance over the thickness in the (Ti,Al,Si)N layer, between a minimum and a maximum content, and between a maximum and a minimum content, of from 0.8 to 1.5 at %/nm, an average gradual change in contents of Al per distance over the thickness in the (Ti,Al,Si)N layer, between a minimum and maximum content, and between a maximum and minimum content, of 0.8 to 1.5 at %/nm, and an average gradual change in contents of Si per distance over the thickness in the (Ti,Al,Si)N layer, between a minimum and maximum content, and between a maximum and minimum content, of from 0.3 to 0.8 at %/nm.

Thus, the (Ti,Al,Si)N layer can be seen as a nano-multilayer of two different sublayers of different contents of Ti, Al and Si. Due to a periodical gradual change in elemental contents, the (Ti,Al,Si)N layer originates from a PVD deposition using a combination of Ti,Al,Si targets of different compositions, a combination of Ti,Al and Ti,Al,Si targets, or, a combination of Ti,Al and Ti,Si targets. Preferably, a combination of Ti,Al and Ti,Al,Si targets are used.

The coated cutting tool comprising a (Ti,Al,Si)N layer as herein disclosed shows high thermal resistance and excellent tool life. The (Ti,Al,Si)N layer shows significant crystallinity which is also of cubic structure, high hardness, high reduced Young's modulus and high thermal conductivity.

Suitably, the average gradual change in contents of Ti per distance over the thickness in the (Ti,Al,Si)N layer, between a minimum and a maximum content, and between a maximum and a minimum content, is from 0.9 to 1.3 at %/nm, the average gradual change in contents of Al per distance over the thickness in the (Ti,Al,Si)N layer, between a minimum and a maximum content, and between a maximum and a minimum content, is from 0.9 to 1.3 at %/nm, and the average gradual change in contents of Si per distance over the thickness in the (Ti,Al,Si)N layer, between a minimum and a maximum content, and between a maximum and a minimum content, is from 0.5 to 0.7 at %/nm.

The average maximum/minimum content of an element in the (Ti,Al,Si)N layer can be calculated by taking at least 8 consecutive maximas/minimas from an elemental analysis, such as STEM-EDS, and calculating an average.

The averaged gradual change in content of an element content per distance over the thickness in the (Ti,Al,Si)N layer can be calculated by subtracting an average minimum content (at %) from an average maximum content (at %) of an element and divide the resulting value by an average distance between the position of a maximum and the position of a minimum content of the element in the (Ti,Al,Si)N layer. At least 8 consecutive maximas/minimas from an elemental analysis are taken into account.

The "gradual" change in content as meant herein means that at a position in the middle of the distance between a maximum and the next minimum in element content, the average local change in content of an element per distance is within the same range as the average gradual change in contents of an element per distance over the thickness in the (Ti,Al,Si)N layer, as defined above for the elements Ti, Al and Si. The average local change in content is calculated by considering the local change in elemental content inbetween at least 8 consecutive maximas/minimas from an elemental analysis.

The noble gas is suitably one or more of Ar, Kr or Ne, preferably Ar.

Suitably, the average distance between two consecutive maxima in content, and between two consecutive minima in content, of any of the elements Ti, Al, and Si is from 5 to 10 nm.

In one embodiment, there is a change in contents of the element N over the thickness of the (Ti,Al,Si)N layer between a minimum and a maximum in content of each element, the average minimum content of N being from 50 to 56 at. %, preferably from 51 to 55 at. %, and the average maximum content of N being from 57 to 63 at. %, preferably from 58 to 62 at. %. The variation of nitrogen content may happen due to that there is a difference in metal element compositions between the targets. Also, different deposition parameters used for the different targets may also affect how much nitrogen is included in a deposited structure. The average distance between two consecutive maxima in content of N, and between two consecutive minima in content of N, is substantially the same as the average distance between two consecutive maxima and two consecutive minima in the contents of the elements Ti, Al, and Si.

In one embodiment, there is an innermost layer of the coating, directly on the substrate, of a nitride of one or more elements belonging to group 4, 5 or 6 of the periodic table of elements, or a nitride of Al together with one or more elements belonging to group 4, 5 or 6 of the periodic table of elements. This innermost layer acts as a bonding layer to the substrate increasing the adhesion of the overall coating to the substrate. Such a bonding layer are commonly used in the art and a skilled person would choose a suitable one. Preferred alternatives for this innermost layer are TiN or (Ti,Al)N. The thickness of this innermost layer is suitably less than 2 μm. The thickness of this innermost layer is in one embodiment from 5 nm to 2 μm, preferably from 10 nm to 1 μm. Since there may also be a need to have an innermost layer functioning as a barrier for Co diffusion into the coating there is a need for the thickness to be at least 50 nm. Si-containing nitride layers are known to attract Co more than most other metal nitride layers. Thus, in a further embodiment this innermost layer is from 50 nm to 2 μm, preferably from 100 nm to 1 μm.

The (Ti,Al,Si)N layer suitably comprises a cubic crystal structure.

The determination of crystal structure or structures present in the (Ti,Al,Si)N layer is suitably made by X-ray diffraction analysis, alternatively TEM analysis.

The FWHM (Full Width at Half Maximum) of a diffraction peak in X-ray diffraction analysis depends on both the degree of crystallinity in the (Ti,Al,Si)N layer and the grain size of crystallites. The smaller the value, the higher the crystallinity and/or the smaller the grain size.

In one embodiment, the (Ti,Al,Si)N layer comprises a cubic crystal structure and wherein the FWHM (Full Width at Half Maximum) of the cubic (200) peak in a theta-2theta scan in X-ray diffraction using Cu k-alpha radiation is from 0.5 to 2.5 degrees 2theta, preferably from 0.75 to 2 degrees 2theta, most preferably from 1 to 1.5 degrees 2theta.

The degree of crystallinity in itself in the (Ti,Al,Si)N layer can be expressed as measured by a peak-to-background ratio in X-ray diffraction analysis. At low crystallinity the diffraction intensity of every (hkl) peak from a certain crystal structure in a theta-2theta scan is low and its relation to the background intensity is, thus, low. One can use the following expression: the intensity of the highest peak $I_{max}$ in a theta-2theta scan of a certain crystal structure minus the intensity of the background at the 2theta position of the peak, $I_{background}$, divided by the intensity of the background at the 2theta position of the peak, $I_{background}$, i.e., $$\text{Peak-to-background ratio}=(I_{max}-I_{background})/I_{background}.$$

The highest peak of a crystal structure is used as $I_{max}$ in the formula since a crystal structure may be of different preferred crystallographic orientations and the relation between intensities of the different (hkl) peaks in a crystal structure may vary.

For the (Ti,Al,Si)N layer of the present invention, the cubic (200) peak is in one embodiment the one of the cubic peaks showing the highest intensity in an X-ray diffraction theta-2theta scan.

In one embodiment the (Ti,Al,Si)N layer comprises a cubic crystal structure and there is a peak-to-background ratio in X-ray diffraction analysis using Cu k-alpha radiation for the cubic (200) peak of ≥2, preferably ≥3, more preferably ≥4, most preferably 5. The peak-to-background ratio in X-ray diffraction analysis using Cu k-alpha radiation for the cubic (200) peak of the (Ti,Al,Si)N layer is in combination of any one of the lower limits suitably ≤15, preferably ≤10.

In one embodiment, the (Ti,Al,Si)N layer comprises lattice planes crossing through the (Ti,Al,Si)N layer having the change in contents of the elements Ti, Al, and Si, in the (Ti,Al,Si)N layer.

In one embodiment, the surface roughness Ra for the (Ti,Al,Si)N layer is ≤0.05 μm, preferably ≤0.03 μm.

In one embodiment, the surface roughness Rz for the (Ti,Al,Si)N layer is ≤0.5 μm, preferably ≤0.25 μm.

In one embodiment, the (Ti,Al,Si)N layer has a Vickers hardness of ≥3500 HV (15 mN load), preferably from 3500 to 3800 HV (15 mN load).

In one embodiment the (Ti,Al,Si)N layer has a reduced Young's modulus of ≥420 GPa, preferably ≥450 GPa.

In one embodiment, the (Ti,Al,Si)N layer has a thermal conductivity of ≤3 W/mK, preferably from 1 to 2.5 W/mK.

In one embodiment, the (Ti,Al,Si)N layer has a residual compressive stress of from 4 to 9 GPa, preferably from 5 to 8 GPa.

If the residual stress is too low then the toughness of the coating will be insufficient. If, on the other hand, the residual stress is too high then flaking of the coating occurs.

The substrate of the coated cutting tool can be of any kind common in the field of cutting tools for metal machining. The substrate is suitably selected from cemented carbide, cermet, cubic boron nitride (cBN), ceramics, polycrystalline diamond (PCD) and high speed steel (HSS).

In one preferred embodiment, the substrate is cemented carbide.

The coated cutting tool is suitably in the form of an insert, a drill or an end mill, having at least one rake face and at least one flank face.

The (Ti,Al,Si)N layer according to the invention is preferably a High-Power Impulse Magnetron Sputtering (HIPIMS)—deposited layer.

The coated cutting tool of the present invention is made by providing one or more pieces of a substrate, charging a PVD reactor with the one or more pieces of cemented carbide substrates and depositing a coating comprising the (Ti,Al,Si)N layer as herein described by suitably using a HIPIMS process.

More preferably, a HIPIMS process is used comprising the use of a combination of at least two different targets being (Ti,Al) and (Ti,Al,Si). In the HIPIMS process the peak pulse power density is preferably ≥340 W/cm$^2$. The specific average target power density is preferably from 20 to 50 W/cm$^2$, the pulse time is preferably from 1 to 5 ms, the pulse frequency is preferably from 15 to 30 Hz, the total pressure is preferably from 0.35 to 0.7 Pa.

The substrate of the coated cutting tool can be of any kind common in the field of cutting tools for metal machining. The substrate is suitably selected from cemented carbide, cermet, cBN, ceramics, PCD and HSS, preferably cemented carbide.

The one or more pieces of substrates are suitably in the form of cutting tool insert blanks, drill blanks or end mill blanks, having at least one rake face and at least one flank face.

Further details of how a coated cutting tool according to the invention can be made are given in the Examples section of this application.

BRIEF DESCRIPTIONS OF THE DRAWINGS

DETAILED DESCRIPTION OF EMBODIMENTS IN DRAWINGS

Figure 1:
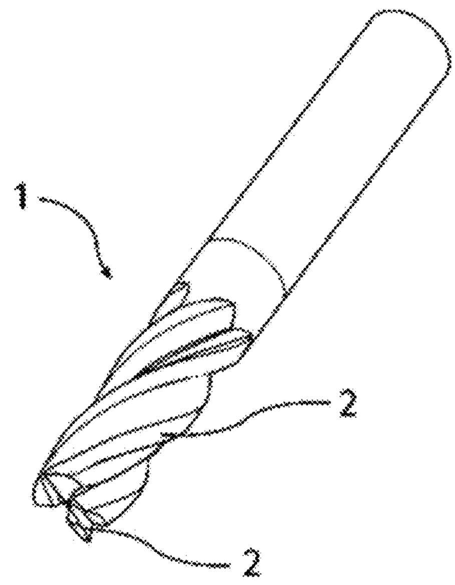
FIG. 1 shows a schematic view of one embodiment of a cutting tool being a solid end mill.
Figure 2:
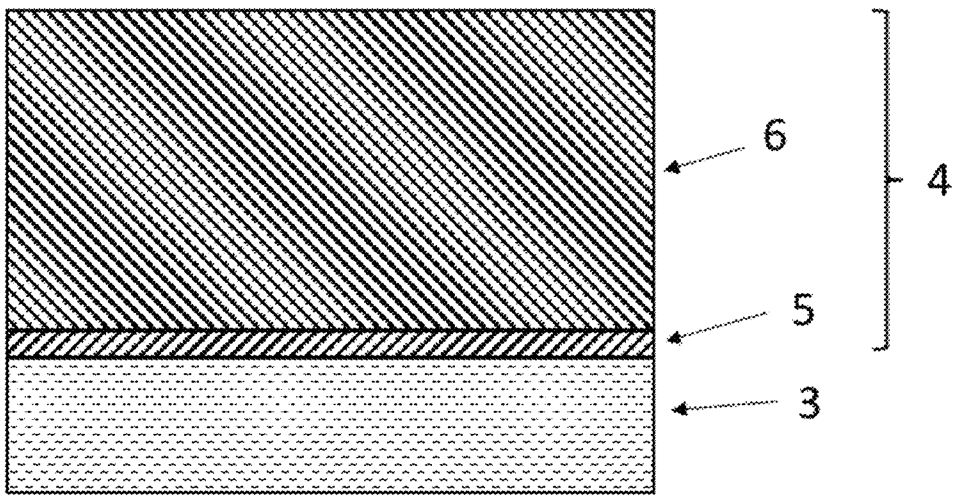
FIG. 2 shows a schematic view of a cross section of an embodiment of the coated cutting tool of the present invention showing a substrate and a coating.
Figure 3:
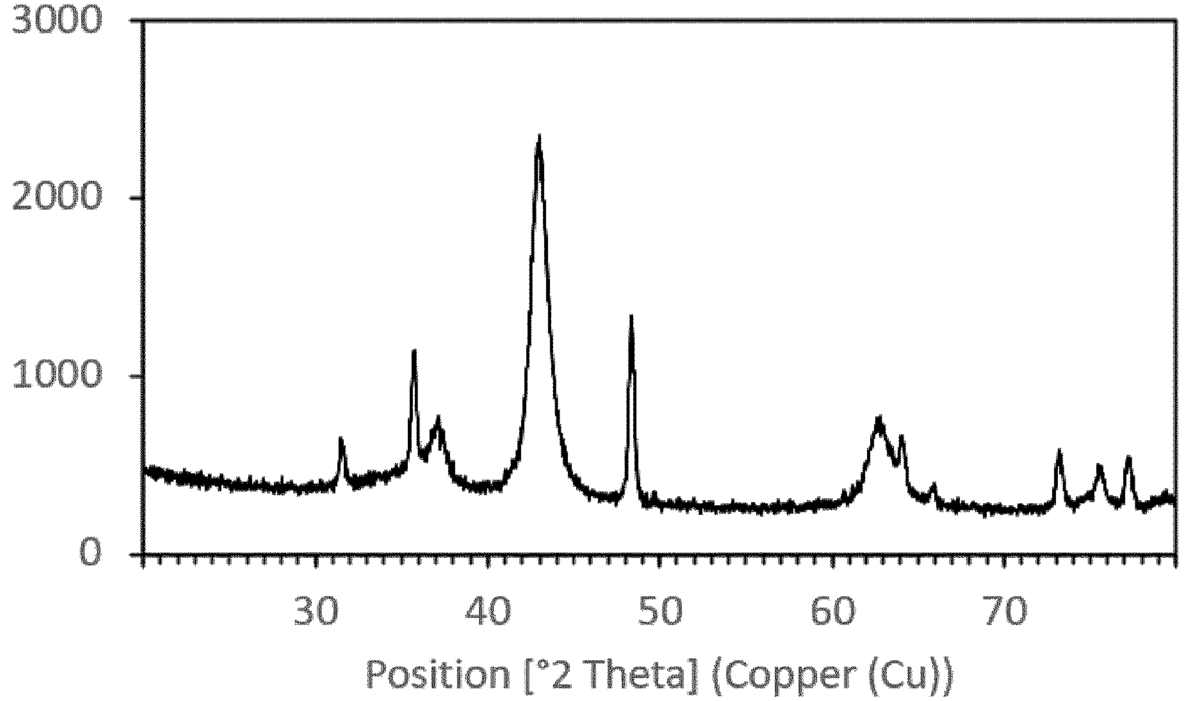
FIG. 3 shows an X-ray diffractogram from a theta-2theta scan for the (Ti,Al,Si)N layer of Sample 1 (invention).
Figure 4:
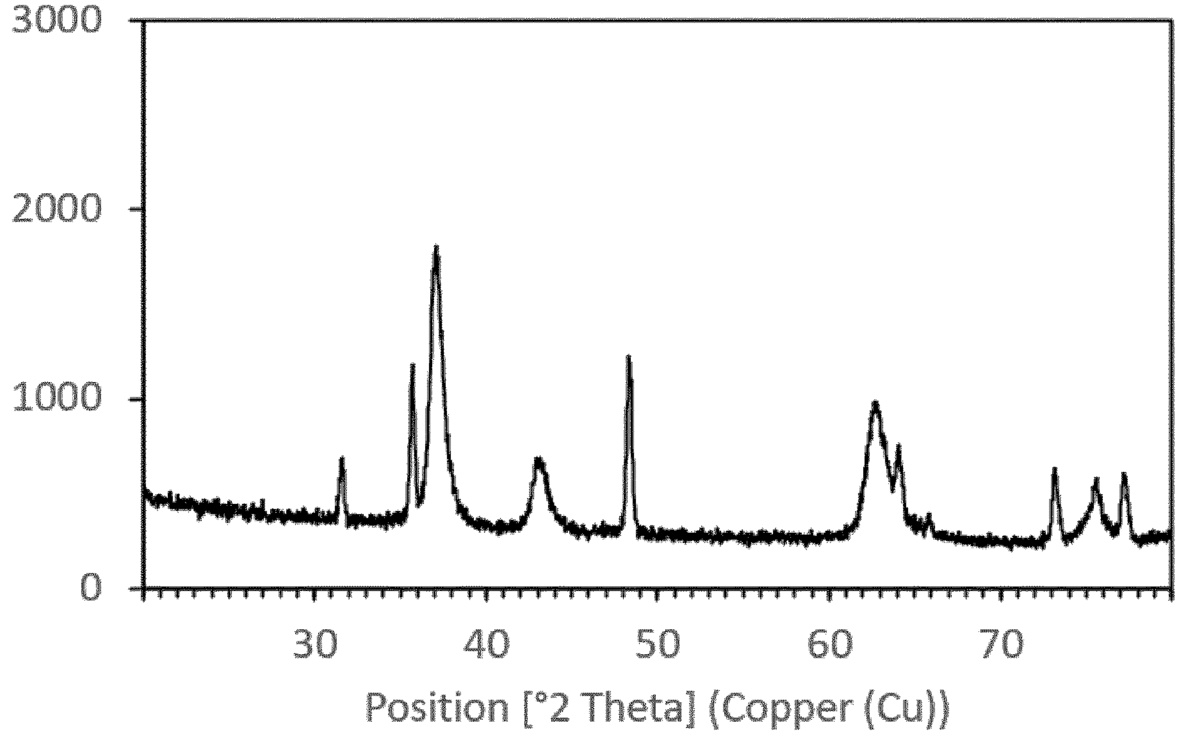
FIG. 4 shows an X-ray diffractogram from a theta-2theta scan for the (Ti,Al)N layer of Sample 2 (reference).
Figure 5:
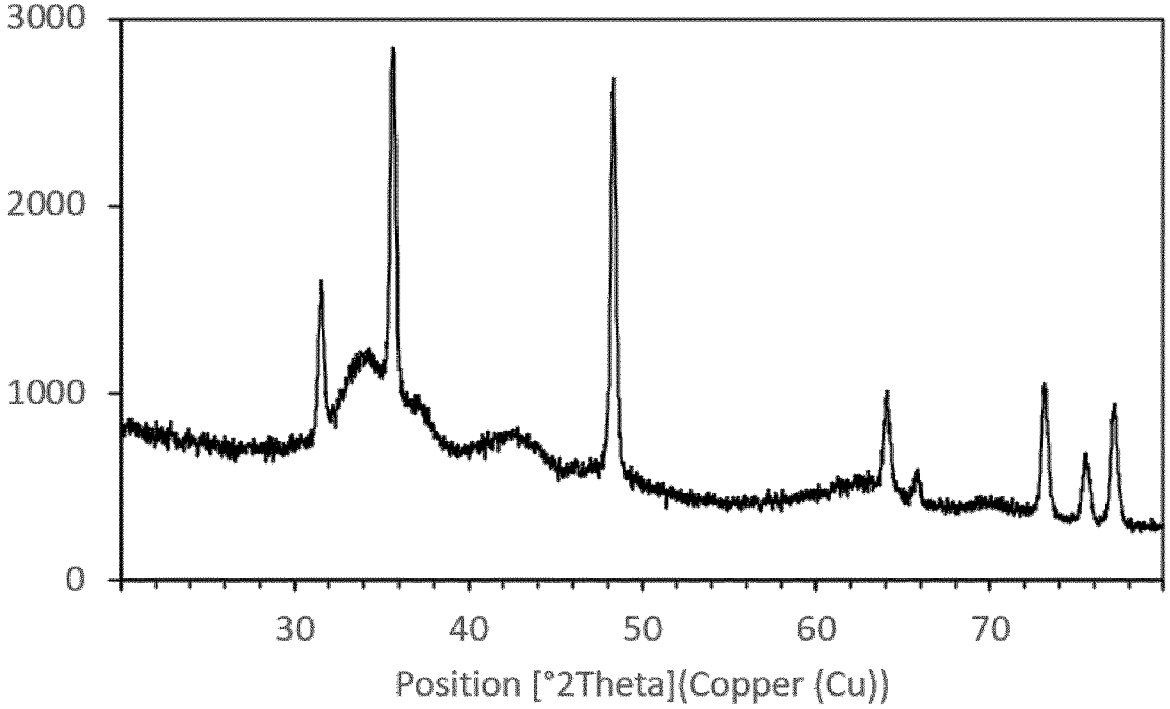
FIG. 5 shows an X-ray diffractogram from a theta-2theta scan for the (Ti,Al,Si)N layer of Sample 4 (reference).
Figure 8:
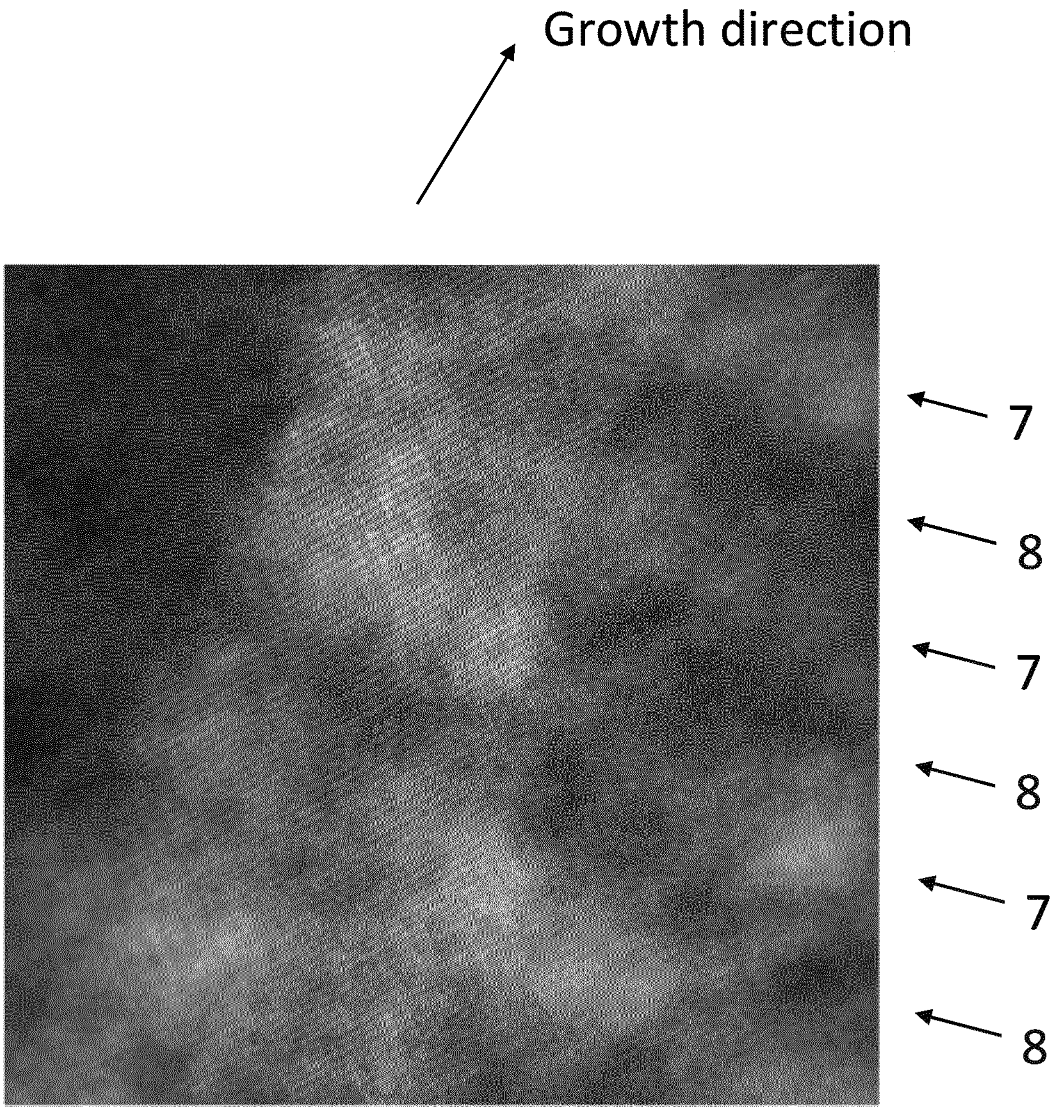
FIG. 8 shows a high resolution transmission electron microscope (HR-TEM) image of a cross-section of the (Ti,Al,Si)N layer of Sample 1 (invention).

FIG. 1 shows a schematic view of one embodiment of a cutting tool (1) having cutting edges (2). The cutting tool (1) is in this embodiment an end mill. FIG. 2 shows a schematic view of a cross section of an embodiment of the coated cutting tool of the present invention having a substrate body (3) and a coating (4). The coating consisting of a first (Ti,Al)N innermost layer (5) followed by a (Ti,Al,Si)N layer (6). FIG. 8 shows a high resolution transmission electron microscope (HR-TEM) image of an cross-section of an embodiment of the (Ti,Al,Si)N layer. A kind of layered structure is seen where bright (7) and dark (8) areas indicate different elemental compositions. It is also seen a pattern of stripes from the crystal structure over the whole (Ti,Al,Si)N layer analysed, Thus, lattice planes are crossing through the bright (7) and dark (8) areas.

Figure 9:
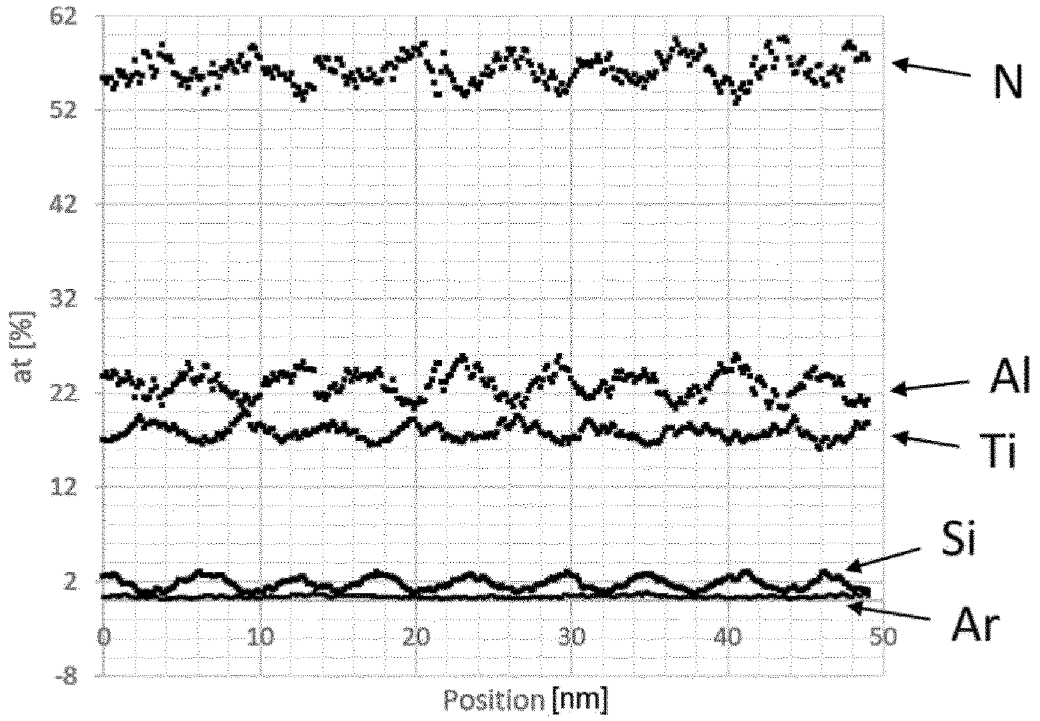
FIG. 9 shows an EDS linescan image from the (Ti,Al,Si)N layer of Sample 1 (invention).

FIG. 9 shows an EDS linescan image from a (Ti,Al,Si)N layer according to the invention. The EDS scan is made on a cross-section of the (Ti,Al,Si)N layer measuring the contents of the different elements Ti, Al, Si, Ar and N over the thickness of the (Ti,Al,Si)N layer.

Methods

X-Ray Diffraction:

The X-ray diffraction patterns were acquired by Grazing incidence mode (GIXRD) on a diffractometer from Panalytical (Empyrean). Cu-Kα-radiation with line focus was used for the analysis (high tension 40 kV, current 40 mA). The incident beam was defined by a 2 mm mask and a ⅛° divergence slit in addition with a X-ray mirror producing a parallel X-ray beam. The sideways divergence was controlled by a Soller slit (0.04°). For the diffracted beam path a 0.18° parallel plate collimator in conjunction with a proportional counter (OD-detector) was used. The measurement was done in grazing incidence mode (Omega=1°). The 2theta range was about 20-80° with a step size of 0.03° and a counting time of 10 s.

Electron Diffraction in Transmission Electron Microscopy (TEM)

In the electron diffraction analysis made herein these are TEM measurements which were carried out using a Transmission Electron Microscope: Zeiss 912 Omega High tension 120 kV). 10 eV energy slit aperture was used. Only the coating should contribute to the diffraction pattern by using a selected area aperture. The TEM was operated with parallell illumination for the diffraction (SAED).

To rule out an amorphisation during sample preparation different methods can be used, i) classical preparation including mechanical cutting, gluing, grinding and ion polishing and ii) using a FIB to cut the sample and make a lift out to make the final polishing.

Elemental Content:

The content of metal elements, nitrogen and argon in the coating was measured by using Scanning Transmission Electron Microscopy (STEM) with Energy Dispersive X-Ray Spectroscopy (EDX) on a cross sectional FIB-prepared sample. For TEM imaging and EDX analysis, Jeol ARM System instrument was used, equipped with a field emission gun, secondary electron-dectector and Si(Li) energy dispersive x-ray (EDX) detector from Oxford Instruments. A spot size of 0.1 nm was used and a step size of 0.15 nm.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each and the holding time (creep time) was 10 seconds. From this curve hardness was calculated.

Reduced Young's Modulus

The reduced Young's modulus (reduced modulus of elasticity) was determined by means of nano-indentation (load-depth graph) as described for determining the Vickers hardness.

Thermal Conductivity

The thermal conductivity of a coating made herein used the Time-domain thermoreflectance (TDTR) method which has the following characteristics:

1. A laser pulse (Pump) is used to heat the sample locally.

2. Depending on the thermal conductivity and heat capacity, the heat energy is transferred from the sample surface towards the substrate. The temperature on the surface decreases by time.

3. The part of the laser being reflected depends on the surface temperature. A second laser pulse (probe pulse) is used for measuring the temperature decrease on the surface.

4. By using a mathematical model the thermal conductivity can be calculated also using the heat capacity value of the sample. Reference is made to (D. G. Cahill, Rev. Sci. Instr. 75, 5119 (2004)).

The samples should be polished into mirror-like finish before the measurement.

Residual Stress

The residual stresses were measured by XRD using the $\sin^2 \psi$ method (c.f. M. E. Fitzpatrick, A. T. Fry, P. Holdway, F. A. Kandil, J. Shackleton and L. Suominen—A Measurement Good Practice Guide No. 52; "Determination of Residual Stresses by X-ray Diffraction—Issue 2", 2005).

The side-inclination method (ψ-geometry) has been used with eight ψ-angles, equidistant within a selected $\sin^2 \psi$ range. An equidistant distribution of ϕ-angles within a ϕ-sector of 90° is preferred. For the calculations of the residual stress values, the Poisson's ratio=0.20 and the Young's modulus E=450 GPa have been applied. For measurements on the (Ti,Al,Si)N layer the data were evaluated using commercially available software (RayfleX Version 2.503) locating the (2 0 0) reflection of (Ti,Al,Si)N by the Pseudo-Voigt-Fit function. For measurements of residual stress of a layer of a coating having further deposited layers above itself coating material is removed above the layer to be measured. Care has to be taken to select and apply a method for the removal of material which does not significantly alter the residual stress within the remaining (Ti,Al,Si)N multilayer material. A suitable method for the removal of deposited coating material may be polishing, however, gentle and slow polishing using a fine-grained polishing agent should be applied. Strong polishing using a coarse grained polishing agent will rather increase the compressive residual stress, as it is known in the art. Other suitable methods for the removal of deposited coating material are ion etching and laser ablation.

Surface Roughness

Average surface roughness, Ra, and mean roughness depth, Rz, were measured with a roughness measuring device P800 type measuring system of the manufacturer JENOPTIK Industrial Metrology Germany GmbH (formerly Hommel-Etamic GmbH) using the evaluation software TURBO WAVE V7.32, determining the waviness according to ISO 11562, TKU300 sensing device and KE590GD test tip with a scan length of 4.8 mm and measured at a speed of 0.5 mm/s.

EXAMPLES

Example 1 (Invention)

A start layer of (Ti,Al)N was deposited onto WC—Co based substrates using a target with the composition $Ti_{0.50}Al_{0.50}$. Then, a (Ti,Al,Si)N layer was further deposited using a target with the composition $Ti_{0.50}Al_{0.50}$ and a target with the composition $Ti_{0.35}Al_{0.55}Si_{0.10}$. The WC—Co based substrates were cutting tools of a milling type (nose end mill, diameter 6 mm) and as well flat inserts (for easier analysis of the coating) using HIPIMS mode in an Oerlikon Balzers Ingenia equipment using S3p technology. The substrates had a composition of 8 wt % Co and balance WC.

The deposition process was run in HIPIMS mode using the following process parameters

| Start layer of (Ti, Al)N: | |
|---|---|
| Target material: | $Ti_{0.50}Al_{0.50}$ *(three)*) |
| Target size: | circular, diameter 15 cm |
| Average power per target: | 7.001 kW |

-continued

| Start layer of (Ti, Al)N: | |
|---|---|
| Peak pulse power: | 60 kW |
| Pulse on time: | 2.927 ms |
| Frequency | 20 Hz |
| Temperature: | 430° C. |
| Total pressure: | 0.6 Pa (N2 + Ar) |
| Argon pressure: | 0.43 Pa |
| Bias potential: | −60 V |
| Number of repeating pulses per cycle: | 2 |
| 2-fold rotation | |

A layer thickness of about 200 nm was deposited.

| Layer of (Ti, Al, Si)N: | |
|---|---|
| Target material 1: | $Ti_{0.50}Al_{0.50}$ |
| Target size: | circular, diameter 15 cm |
| Average power per target: | 7.001 kW |
| Peak pulse power: | 60 kW |
| Pulse on time: | 2.927 ms |
| Target material 2: | $Ti_{0.35}Al_{0.55}Si_{0.10}$ |
| Target size: | circular, diameter 15 cm |
| Average power per target: | 4.776 kW |
| Peak pulse power: | 60 kW |
| Pulse on time: | 2.000 ms |
| Frequency calculated from the cycles: | 20 Hz |
| Temperature: | 430° C. |
| Total pressure: | 0.6 Pa |
| Argon pressure: | 0.43 Pa |
| Bias potential: | −60 V |
| Number of repeating pulses per cycle: | 2 |
| 2-fold rotation | |

A (Ti,Al,Si)N layer with a thickness of about 2 μm was deposited.

The coated cutting tool provided is called "Sample 1 (invention)"

Example 2 (Reference)

A (Ti,Al)N layer from a target with the composition $Ti_{0.40}Al_{0.60}$ was deposited onto WC—Co based substrates being cutting tools of a milling type (nose end mill, diameter 6 mm) and as well flat inserts (for easier analysis of the coating) using HIPIMS mode in an Oerlikon Balzers equipment using S3p technology. This HIPIMS-deposited coating was known to give very good results in machining of hardened steel (ISO-H) materials.

The substrates had a composition of 8 wt % Co and balance WC.

The deposition process was run in HIPIMS mode using the following process parameters

| | |
|---|---|
| Target material 1: | $Ti_{0.40}Al_{0.60}$ |
| Target size: | circular, diameter 15 cm |
| Average power per target: | 4.800 kW |
| Peak pulse power: | 60 kW |
| Pulse on time: | 4.00 ms |
| Temperature: | 430° C. |
| Total pressure: | 0.55 Pa |
| Argon pressure: | 0.43 Pa |
| Bias potential: | −80 V |
| Number of repeating pulses per cycle: | 1 |
| 2-fold rotation | |

A layer thickness of about 2 μm was deposited.

The coated cutting tool provided is called "Sample 2 (reference)"

Furthermore, a (Ti,Al)N layer from a target with the composition $Ti_{0.50}Al_{0.50}$ was deposited onto WC—Co based substrates being flat cutting tool inserts (for easier analysis of the coating) using HIPIMS mode in the same Oerlikon Balzers equipment using S3p technology. The process parameters were the same as when depositing the (Ti,Al)N layer from a target with the composition $Ti_{0.40}Al_{0.60}$. A layer thickness of about about 2 μm was deposited. The coated cutting tool provided is called "Sample 3 (reference)"

Example 3 (Reference)

A (Ti,Al,Si)N mono-layer from a target with the composition $Ti_{0.35}Al_{0.55}Si_{0.10}$ was deposited onto WC—Co based substrates being flat cutting inserts for easy analysis of the coating. The deposition was made using HIPIMS mode in an Oerlikon Balzers equipment using S3p technology using the following process parameters:

| | |
|---|---|
| Target material 2: | $Ti_{0.35}Al_{0.55}Si_{0.10}$ |
| Target size: | circular, diameter 15 cm |
| Average power per target: | 5.1 kW |
| Peak pulse power: | 60 kW |
| Pulse on time: | 2.100 ms |
| Pulse frequency | 20 Hz |
| Temperature: | 430° C. |
| Total pressure: | 0.64 Pa |
| Argon pressure: | 0.43 Pa |
| Bias potential: | −80 V |
| Number of repeating pulses per cycle: | 43 |
| 2-fold rotation | |

A layer thickness of about about 1.5 μm was deposited. The coated cutting tool provided is called "Sample 4 (reference)"

Example 4 (Analysis)

X-ray diffraction (XRD) theta-2theta analysis was made on Samples 1, 2 and 4.

FIGS. 3-6 show the XRD theta-2theta diffractograms for Sample 1 (invention), Sample 2 (reference), Sample 2 (reference) and Sample 4 (reference).

It is seen that the diffractogram for Sample 1 (invention) a cubic crystal structure is revealed. The diffractogram shows significant cubic (111) and cubic (200) peaks at around 37-38 degrees 2theta and around 42-43 degrees 2theta, respectively. This implies significant crystallinity. The peak with the highest intensity is the (200) peak. The peak-to-background ratio for the (200) peak is estimated to be about 6.0.

The FWHM (Full Width at Half Maximum) of the cubic (200) peak is about 1.2 degrees 2theta.

The diffractogram for Sample 2 (reference) shows a highly crystalline structure of the monolayer of (Ti,Al)N. The (111) peak is here more predominant than the (200) peak indicating a (111) crystal texture. There is an absence of any broad underlying reflections from amorphous structures.

Finally, the diffractogram for Sample 4 (reference) shows much less significant cubic (111) and cubic (200) peaks than Sample 1 (invention). The (111) peak can hardly be distinguished from a broad underlying reflection which ranges from about 31-39 degrees 2theta. There is also a broad underlying reflection ranging from about 40-45 degrees 2theta which covers the position where the cubic (200) peak is. These broad reflections implies presence of significant amorphous structure. The much lower degree of crystallinity can be determined from the peak-to-background ratio for the (200) peak which is only estimated to be about 0.3.

The Full Width at Half Maximum (FWHM) of this less significant cubic (200) peak is quite difficult to determine but is estimated to be about 4 degrees 2theta.

Figure 6:
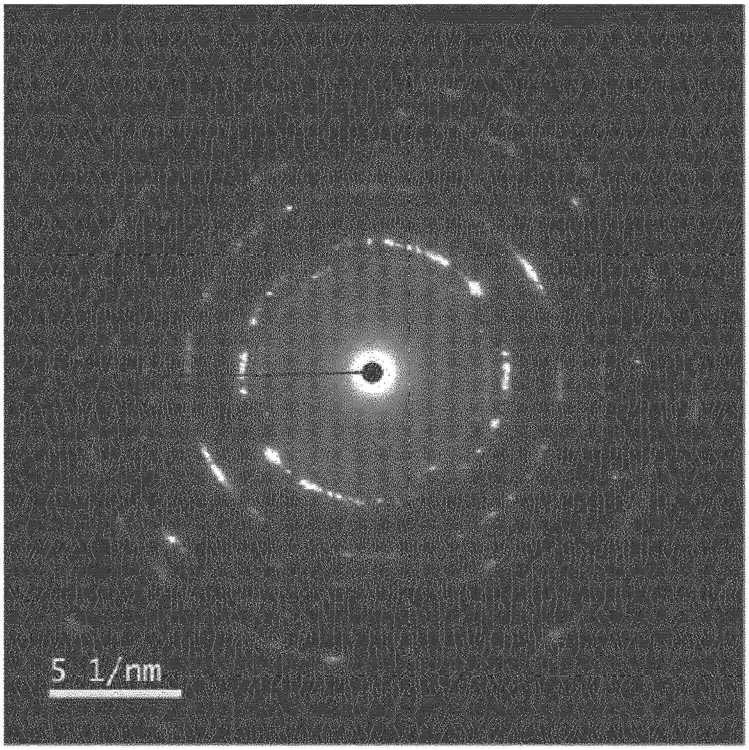
FIG. 6 shows a transmission electron microscope (TEM) electron diffraction image for the (Ti,Al,Si)N layer of Sample 1 (invention).
Figure 7:
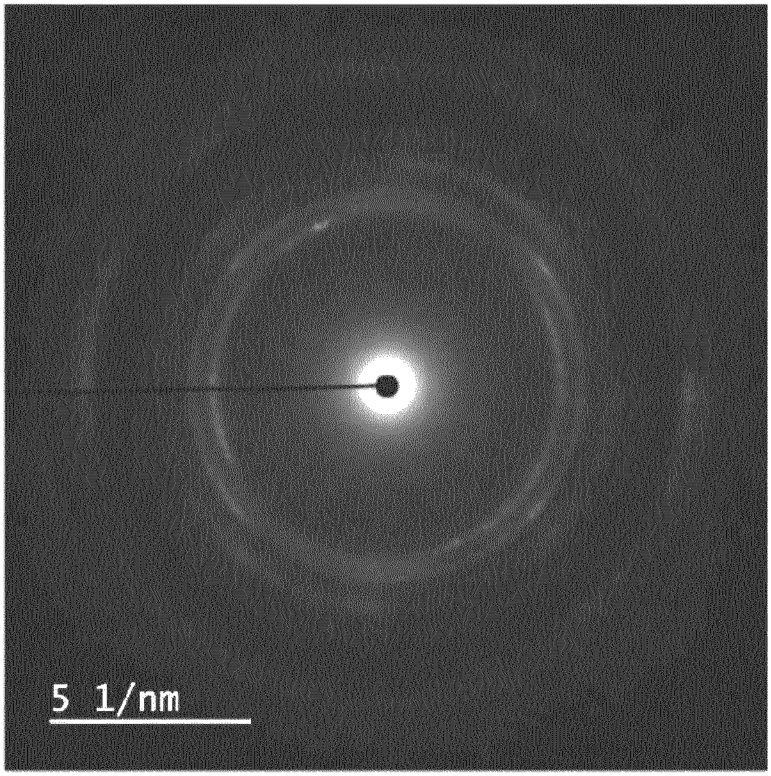
FIG. 7 shows a TEM electron diffraction image for the (Ti,Al,Si)N layer of Sample 4 (reference).

Electron diffraction analysis using Transmission electron Microscopy (TEM) was made on Sample 1 (invention) and Sample 4 (reference). FIGS. 6-7 show the electron diffraction patterns obtained.

It is seen that the pattern of the invention shows distinguished reflection spots at certain scattering vectors (distance from the centre) proving a highly crystalline structure for Sample 1 (invention). For Sample 4 (reference), on the other hand, a diffuse pattern indicating a significant amorphous phase is seen.

From a high-resolution TEM (HR-TEM) image, see FIG. 8, one could see lattice planes crossing through the modulated layer structure.

A TEM-EDX linescan was made on Sample 1 (invention). FIG. 9 shows the results. It is clear that there is a kind of modulated layer present with a gradual change in content of the elements Ti, Al, and Si, between a minimum content and a maximum content over the thickness of the layer. Thus, there is a plurality of maxima and minima in elemental content for each element over the thickness of the layer.

In the periodical change in contents of the elements Ti, Al, and Si, the average minimum content of Ti is about 16 at. % and the average maximum content of Ti is about 19 at. %.

In the periodical change in contents of the elements Ti, Al, and Si, the average minimum content of Al is about 21 at. % and the average maximum content of Al is about 25 at. %.

In the periodical change in contents of the elements Ti, Al, and Si, the average minimum content of Si is about 1 at. % and the average maximum content of Si is about 3 at. %.

There is a change in contents of the element N over the thickness of the (Ti,Al,Si)N layer between a minimum and a maximum in content of each element, the average minimum content of N being about 54 at. % and the average maximum content of N being about 59 at. %.

All the above minimum and maximum contents values can be extracted from the TEM-EDS linescan in FIG. 9.

The average content of each element in the (Ti,Al,Si)N layer was also analysed with TEM-EDX. The result is seen in Table 1.

TABLE 1

| Element | Ti | Al | Si | N | Ar |
|---|---|---|---|---|---|
| Average content (at. %) | 17.9 | 23.1 | 1.8 | 56.8 | 0.4 |

The average composition of the (Ti,Al,Si)N can also be written as: $Ti_{0.42}Al_{0.54}Si_{0.04}N_x$, the sum of atomic parts of Ti, Al and Si equals 1, the atomic ratio N to metal elements (Ti, Al, Si), i.e., 'x', is about 1.3.

The average distance between two consecutive maxima in content, and between two consecutive minima in content, of any of the elements Ti, Al, and Si is about 6 nm.

In the periodical change in contents of the elements Ti, Al, and Si over the thickness of the (Ti,Al,Si)N layer the maximum content of Ti, the minimum content of Al and the minimum content of Si coincide in average over the thickness of the (Ti,Al,Si)N layer, and, the minimum content of Ti, the maximum content of Al and the maximum content of Si coincide in average over the thickness of the (Ti,Al,Si)N layer.

There is an average gradual change in contents of Ti per distance over the thickness in the (Ti,Al,Si)N layer, between a minimum and a maximum content, and between a maximum and a minimum content, of about 1 at %/nm.

There is an average gradual change in contents of Al per distance over the thickness in the (Ti,Al,Si)N layer, between a minimum and maximum content, and between a maximum and minimum content, of about 1.3 at %/nm There is an average gradual change in contents of Si per distance over the thickness in the (Ti,Al,Si)N layer, between a minimum and maximum content, and between a maximum and minimum content, of about 0.7 at %/nm.

Residual stress was also measured on Sample 1 (invention) showing a value of −6.9 GPa.

The thermal conductivity was determined using the Time-domain thermoreflectance (TDTR) method. Table 2 shows the results.

TABLE 2

| | average composition | Structure | Thermal conductivity [W/mK] |
|---|---|---|---|
| Sample 1 (invention) | $Ti_{0.42}Al_{0.54}Si_{0.04}N_x$ | modulated structure from targets $Ti_{0.50}Al_{0.50}$ and $Ti_{0.35}Al_{0.55}Si_{0.10}$ | 2.0 |
| Sample 2 (reference) | $Ti_{0.40}Al_{0.60}N$ | $Ti_{0.40}Al_{0.60}N$ monolayer | 4.6 |
| Sample 3 (reference) | $Ti_{0.50}Al_{0.50}N$ | $Ti_{0.50}Al_{0.50}N$ monolayer | 4.7 |
| Sample 4 (reference) | $Ti_{0.35}Al_{0.55}Si_{0.10}N$ | $Ti_{0.35}Al_{0.55}Si_{0.10}N$ monolayer | 1.8 |

Since monolayers made from targets used for making the modulated layer of Sample 1 (invention) showed thermal conductivity values of 1.8 W/mK (for $Ti_{0.35}Al_{0.55}Si_{0.10}N$) and 4.7 W/mK (for $Ti_{0.50}Al_{0.50}N$) an average value of 3.3 W/mK could be expected. However, the result for Sample 1 (invention) was 2.0 W/mK, i.e., low thermal conductivity giving an advantage in heat generating severe metal cutting.

Hardness measurements (load 15 mN) were carried out on the flank face of the coated tool of Sample 1 and Sample 4 to determine Vickers hardness and reduced Young's modulus (EIT). Table 3 shows the results.

TABLE 3

| Coating | Hardness HV [Vickers] | Reduced Young's modulus, EIT [GPa] |
|---|---|---|
| Sample 1 (invention) | 3790 | 431 |
| Sample 4 (reference) | 2443 | 290 |

Example 5

Cutting test of Sample 1 (invention) and Sample 2 (reference):

Sample 1 (invention) and Sample 2 (reference) being end mill tools with diameter 6 mm, were tested in a milling test, and the localized flank wear was measured. The cutting conditions are summarized in Table 4. As workpiece material hardened steel ISO-H was used. Cutting operations on such a material generate particularly high heat at the cutting edge.

Cutting Conditions:

TABLE 4

| | |
|---|---|
| Tooth Feed $f_z$ [mm/tooth] | 0.09 |
| Cutting speed $v_c$ [m/min] | 185 |
| Cutting width $a_e$ [mm] | 0.12 (0.1 × tool diameter) |
| Cutting depth $a_p$ [mm] | 0.12 |
| Workpiece Material | ISO-H; 1.2379 (61HRC) |

In this test the wear maximum was observed at the cutting edge on the flank side. Two cutting edges were tested of each coating and the averaged value for each cutting length is shown in Table 5.

TABLE 5

| | Cutting length (m) | | |
|---|---|---|---|
| Sample | 30 | 60 | 90 |
| Sample 1 (invention) $VB_{max}$ [mm] | 0.02 | 0.04 | 0.04 |
| Sample 2 (reference) $VB_{max}$ [mm] | 0.03 | 0.06 | 0.07 |

Figure 10:
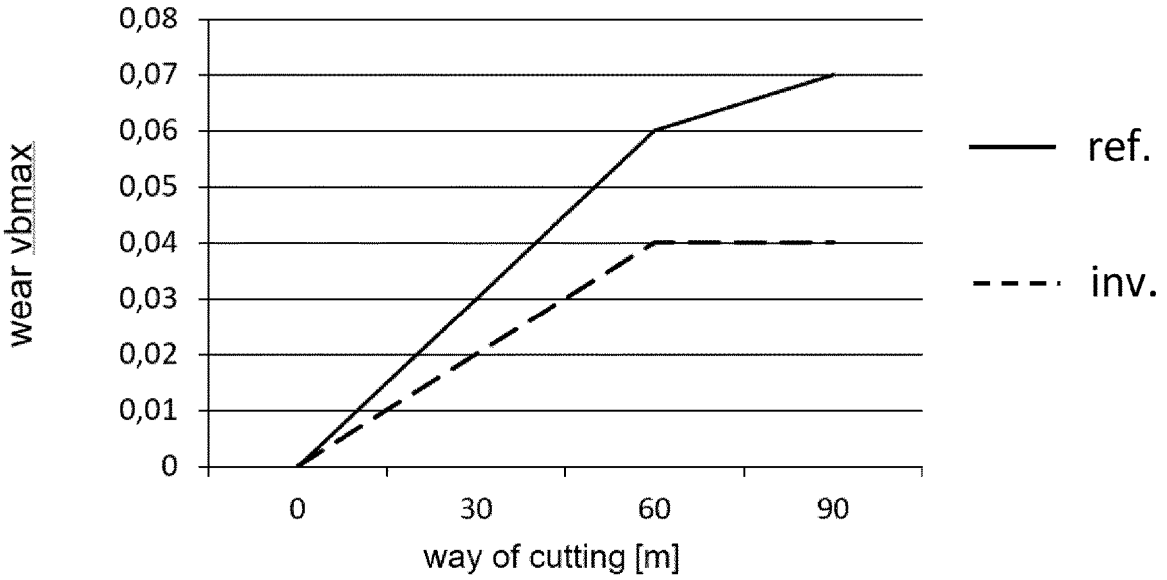
FIG. 10 shows cutting test results in a milling operation of Sample 1 (invention) and Sample 2 (reference).

Sample 2 (reference) has a coating known to give very good results in milling of hardened steel (ISO-H) materials. Nevertheless, it is concluded that Sample 1 (invention) performs much better than Sample 2 (reference). FIG. 10 is also visualising this.

Regarding Sample 4, although not specifically tested, already due to the bad mechanical properties (low hardness and low elastic modulus) of its (Ti,Al,Si)N layer, very bad results in the above cutting test would be the result.

The invention claimed is:

1. A coated cutting tool comprising a substrate and a coating, the coating comprising a (Ti,Al, Si)N layer wherein the (Ti,Al,Si)N layer has a periodical change in contents of elements Ti, Al, and Si, over a thickness of the (Ti,Al,Si)N layer, between a minimum content and a maximum content of each element, wherein an average minimum content of Ti, over the entire thickness of the (Ti,Al, Si)N layer, is a value within a range of from 14 to 18 at. %, an average maximum content of Ti, over the entire thickness of the (Ti,Al, Si)N layer, is a value within a range of from 18 to 22 at. %, an average minimum content of Al, over the entire thickness of the (Ti,Al, Si)N layer, is a value within a range of from 18 to 22 at. %, an average maximum content of Al, over the entire thickness of the (Ti,Al, Si)N layer, is a value within a range of from 24 to 28 at. %, an average minimum content of Si, over the entire thickness of the (Ti, Al, Si)N layer, is a value within a range of from 0 to 2 at. %, an average maximum content of Si, over the entire thickness of the (Ti,Al,Si)N layer, is a value within a range of from 1 to 5 at. %, the average minimum content and the average maximum content of the elements Ti, Al, and Si, are determined by taking at least eight consecutive minima/maxima from an elemental analysis and calculating an average, a remaining content in the (Ti, Al, Si)N layer is a noble gas with an average content of from 0.1 to 5 at. % and the element N, an average distance between two consecutive maxima in content, and between two consecutive minima in content, over the entire thickness of the (Ti,Al, Si)N layer, of any of the elements Ti, Al, and Si, is a value within a range of from 3 to 15 nm, the average distance being determined by taking at least eight consecutive maxima/minima from an elemental analysis and calculating an average value, in a periodical change in contents of the elements Ti, Al, and Si over the entire thickness of the (Ti,Al, Si)N layer the maximum content of Ti, the minimum content of Al and the minimum content of Si coincide in average over the entire thickness of the (Ti,Al, Si)N layer, and the minimum content of Ti, the maximum content of Al and the maximum content of Si coincide in average over the entire thickness of the (Ti,Al, Si)N layer, there is an average gradual change in contents of Ti per distance over the entire thickness of the (Ti,Al, Si)N layer, between a minimum and a maximum content, and between a maximum and a minimum content, which is a value within a range of from 0.8 to 1.5 at %/nm, an average gradual change in contents of Al per distance over the entire thickness in the (Ti,Al, Si)N layer, between a minimum and maximum content, and between a maximum and minimum content, which is a value within a range of from 0.8 to 1.5 at %/nm, and an average gradual change in contents of Si per distance over the entire thickness in the (Ti,Al, Si)N layer, between a minimum and maximum content, and between a maximum and minimum content, which is a value within a range of from from 0.3 to 0.8 at %/nm, the average gradual change in contents of the elements Ti, Al, and Si, respectively, per distance over the entire thickness in the (Ti, Al, Si)N layer, is determined by subtracting an average minimum content (at %) from an average maximum content (at %) of the Ti, Al, and Si elements and dividing the resulting value by the average distance between the position of a maximum and a position of a minimum content of the Ti, Al, and Si elements in the (Ti,Al,Si)N layer, at least eight consecutive maxima/minima from an elemental analysis are being taken into account.

2. The coated cutting tool according to claim 1, wherein the average gradual change in contents of Ti per distance over the entire thickness in the (Ti, Al, Si)N layer, between a minimum and a maximum content, and between a maximum and a minimum content, is from 0.9 to 1.3 at %/nm, the average gradual change in contents of Al per distance over the entire thickness in the (Ti,Al, Si)N layer, between a minimum and a maximum content, and between a maximum and a minimum content, is from 0.9 to 1.3 at %/nm, and the average gradual change in contents of Si per distance over the entire thickness in the (Ti,Al,Si)N layer, between a minimum and a maximum content, and between a maximum and a minimum content, is from 0.5 to 0.7 at %/nm.

3. The coated cutting tool according to claim 1, wherein the noble gas is one or more of Ar, Kr or Ne.

4. The coated cutting tool according to claim 1, wherein the average distance between two consecutive maxima in content, and between two consecutive minima in content, of any of the elements Ti, Al, and Si is from 5 to 10 nm.

5. The coated cutting tool according to claim 1, wherein there is a change in contents of the element N over the entire thickness of the (Ti,Al, Si)N layer between a minimum and a maximum in content of each element, an average minimum content of N, over the entire thickness of the (Ti,Al, Si)N layer, which is a value within a range of from 50 to 56 at. %, and an average maximum content of N, over the entire thickness of the (Ti, Al, Si)N layer, being a value within a range of from 57 to 63 at. %, the average minimum content and the average maximum content of the element N are determined by taking at least eight consecutive minima/maxima from an elemental analysis and calculating an average value.

6. The coated cutting tool according to claim 1, wherein there is an innermost layer of the coating, disposed directly on the substrate, of a nitride of one or more elements belonging to group 4, 5 or 6, or a nitride of Al together with one or more elements belonging to group 4, 5 or 6, and wherein the thickness of the innermost layer is less than 2 μm.

7. The coated cutting tool according to claim 1, wherein the (Ti,Al,Si)N layer has a cubic crystal structure and wherein a FWHM (Full Width at Half Maximum) of cubic (200) peak in a theta-2theta scan in X-ray diffraction using Cu k-alpha radiation is from 0.5 to 2.5 degrees 2theta.

8. The coated cutting tool according to claim 1, wherein the (Ti,Al,Si)N layer has a cubic crystal structure and there is a peak to background ratio in X-ray diffraction analysis using Cu k-alpha radiation for the cubic (200) peak of ≥2.

9. The coated cutting tool according to claim 1, wherein the (Ti,Al, Si)N layer has lattice planes crossing through the (Ti,Al,Si)N layer having a variation in contents of the elements Ti, Al, and Si, in the (Ti, Al,Si)N layer.

10. The coated cutting tool according to claim 1, wherein the (Ti,Al, Si)N layer has a Vickers hardness of ≥3500 HV (15 mN load).

11. The coated cutting tool according to claim 1, wherein the (Ti,Al, Si)N layer has a reduced Young's modulus of ≥420 GPa.

12. The coated cutting tool according to claim 1, wherein the (Ti,Al, Si)N layer has a thermal conductivity of ≤3 W/mK.

13. The coated cutting tool according to claim 1, wherein the (Ti,Al, Si)N layer has a residual compressive stress of from 4 to 9 GPa.

14. The coated cutting tool according to claim 1, wherein the substrate is selected from cemented carbide, cermet, cubic boron nitride (cBN), ceramics, polycrystalline diamond (PCD) and high speed steel (HSS).

15. The coated cutting tool according to claim 1, which is in the form of an insert, a drill or an end mill, having at least one rake face and at least one flank face.

* * * * *